United States Patent
Oliaei et al.

(10) Patent No.: US 7,880,654 B2
(45) Date of Patent: Feb. 1, 2011

(54) CONTINUOUS-TIME SIGMA-DELTA MODULATOR WITH MULTIPLE FEEDBACK PATHS HAVING INDEPENDENT DELAYS

(75) Inventors: Omid Oliaei, Tempe, AZ (US); Brandt Braswell, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 27 days.

(21) Appl. No.: 12/394,275

(22) Filed: Feb. 27, 2009

(65) Prior Publication Data

US 2010/0219999 A1 Sep. 2, 2010

(51) Int. Cl.
*H03M 3/00* (2006.01)
(52) U.S. Cl. .................. 341/143; 341/155
(58) Field of Classification Search ............. 341/118, 341/120, 143, 155, 144
See application file for complete search history.

(56) References Cited

U.S. PATENT DOCUMENTS

| | | | |
|---|---|---|---|
| 6,313,773 B1 | 11/2001 | Wilson et al. | |
| 6,414,615 B1 | 7/2002 | Cheng | |
| 6,531,973 B2 | 3/2003 | Brooks et al. | |
| 6,909,394 B2 * | 6/2005 | Doerrer et al. | 341/200 |
| 7,042,377 B2 | 5/2006 | Oliaei | |
| 7,183,957 B1 | 2/2007 | Melanson | |
| 7,535,392 B2 * | 5/2009 | Weng et al. | 341/143 |
| 7,633,419 B2 | 12/2009 | Hernandez et al. | |
| 7,696,913 B2 | 4/2010 | Melanson | |
| 2005/0068213 A1 | 3/2005 | Fontaine et al. | |
| 2007/0210948 A1 | 9/2007 | Wang | |
| 2008/0100486 A1 | 5/2008 | Lin | |
| 2008/0136693 A1* | 6/2008 | Kim et al. | 341/143 |
| 2008/0143567 A1 | 6/2008 | Vadipour | |
| 2008/0272946 A1* | 11/2008 | Melanson | 341/143 |

FOREIGN PATENT DOCUMENTS

WO 03052939 A2 6/2003

OTHER PUBLICATIONS

Oliaei, O., State-Space Analysis of Clock Jitter in Continuous-Time Oversampling Data Converters, IEEE Transactions on Circuits and Systems II: Analog and Digital Signal Processing, vol. 50, Jan. 2003, pp. 31-37.

(Continued)

*Primary Examiner*—Jean B Jeanglaude
(74) *Attorney, Agent, or Firm*—Ingrassia Fisher & Lorenz, P.C.

(57) ABSTRACT

Apparatus are provided for continuous-time sigma-delta modulators. A sigma-delta modulator comprises a quantizer configured to convert an analog signal to a digital value. A main feedback arrangement is coupled to the quantizer, and the main feedback arrangement delays the digital value by a first delay period and generates a main feedback signal based on the delayed value. A compensation feedback arrangement is coupled to the quantizer, and compensation feedback arrangement delays the digital value by a second delay period and generates a compensation feedback signal based on the delayed value. A forward signal arrangement produces the analog signal at the quantizer based on an input signal, the main feedback signal, and the compensation feedback signal. The second delay period is independent of and is not influenced by the first delay period, and the second delay period is chosen such that the compensation feedback signal compensates for the first delay period.

19 Claims, 3 Drawing Sheets

OTHER PUBLICATIONS

Shoaei, O., Continuous-Time Delta-Sigma A/D Converters for High Speed Applications, Ph.D. Thesis, Carleton University, 1995.

Jensen, J., et al., A 3.2-GHz secondorder delta-sigma modulator implemented in InP HBT technology, IEEE J. Solid-State Circuits, vol. 30, pp. 1119-1127, Oct. 1995.

Cherry, J. A., et al., Excess loop delay in continuous-time deltasigma modulators, IEEE Transactions on Circuits and Systems II: Analog and Digital Signal Processing, vol. 46, Apr. 1999, pp. 376-389.

Oliaei, O., Design of continuous-time sigma-delta modulators with arbitrary feedback waveform, IEEE Transactions on Circuits and Systems II: Analog and Digital Signal Processing, vol. 50, Aug. 2003, pp. 437-444.

Benabes, B., et al., A Methodology for Designing Continuous-Time Sigma-Delta Modulators, in Proc. 1997 Europ. Design Test Conf., vol. 1, pp. 46-50.

Yan, S., et al., A continuous-time sigma-delta modulator with 88-dB dynamic range and 1.1-MHz signal bandwidth, in Dig. Tech. Papers 2003 IEEE Int. Solid-State Circuits Conf., vol. 1, pp. 62-63 and 471-478.

Mitteregger, G. et al., A 14b 20mW 640MHz CMOS CT ADC with 20MHz Signal Bandwidth and 12b ENOB, in Dig. Tech. Papers 2006 IEEE Int. Solid-State Circuits Conf., pp. 131-140.

Fontaine, P., et al., A low-noise low-voltage CT modulator with digital compensation of excess loop delay, in Dig. Tech. Papers 2005 IEEE Int. Solid-State Circuits Conf., vol. 1, pp. 498-499 and 613.

Keller, M., et al., A Comparative Study on Excess Loop Delay Compensation Techniques for Continuous-Time Sigma-Delta Modulators, IEEE Transactions on Circuits and Systems I, vol. 55, No. 11, pp. 3480-3487, Dec. 2008.

Luschas, S., et al., High-speed sigmadelta modulators with reduced timing jitter sensitivity, IEEE Trans. Circuits Syst. II, Analog Digit. Signal Process., vol. 49, No. 11, pp. 712-720, Nov. 2002.

Ortmanns, M., et al., A Continuous-time Sigma-Delta Modulator with Reduced Sensitivity to Clock Jitter through SCR Feedback, IEEE Transactions on Circuits and Systems I: Fundamental Theory and Applications, vol. 52, May 2005, pp. 875-884.

Colodro, F., et al., New Continuous-Time Multibit Sigma-Delta Modulators with Low Sensitivity to Clock Jitter, IEEE Transactions on Circuits and Systems, vol. 56, No. 1, Jan. 2009.

Su, D., et al., A CMOS Oversampling D/A Converter with a Current-Mode Semi-Digital Reconstruction Filter, IEEE J. Solid-State Circuits, vol. 28, pp. 1224-1233, Dec. 1993.

Oliaei, O., Sigma-Delta Modulator with Spectrally Shaped Feedback, IEEE Transactions on Circuits and Systems II: Analog and Digital Signal Processing, vol. 50, Oct. 2003, pp. 518-530.

Putter, B., Sigma-Delta ADC with Finite Impulse Response Feedback DAC, IEEE International Solid-State Circuits Conference, 2004, Feb. 2004, pp. 76-77.

Vaidyanathan, P. P., Multirate Systems and Filter Bank, Polyphase Networks, and Applications: A Tutorial, Proceeding of the IEEE vol. 78, No. 1, Jan. 1990.

Horbach, U., Design of a 20 Bit Sigma-Delta A/D-Converter for Audio Applications, in Proc. 1990 IEEE Int. Symp. Circuits Syst., vol. 4, pp. 2789-2792.

Schreier, R., et al., Delta-Sigma Modulators Employing Continuous-Time Circuitry, IEEE Transactions on Circuits and Systems I: Fundamental Theory and Applications, vol. 43, Apr. 1996, pp. 324-332.

Yan, S., et al., A continuous-time sigma-delta modulator with 88-dB dynamic range and 1.1-MHz signal bandwidth, IEEE Jornal of Solid-State Circuits, vol. 39 No. 1, Jan. 2004 pp. 75-86.

Mitteregger, G. et al., A 20mW 640MHz CMOS CT sigmadelta ADC with 20MHz Signal Bandwidth 80-dB Dynamic Range and 12b ENOB, IEEE Solid-State Circuits, vol. 41, No. 12, Dec. 2006, pp. 2641-2649.

Shoaei, O., Design and Implementation of a Tunable 40 MHz-70 MHz Gm_C Bandpass sigmadelta Modulator, IEEE Transactions on Circuits and Systems -II: Analog and Digital Signal Processing, vol. 44, No. 7, Jul. 1997.

Office Action in U.S Appl. No. 12/394,256 dated Jun. 10, 2010.

Gao; "Excess Loop Delay Effects in Continuous-Time Delta-Sigma Modulators and the Compensation Solution"; 1997 IEEE International Symposium on Circuits and Systems; Jun. 9-12, 1997.

Shoaei; "A multi-feedback design for LC bandpass Delta-Sigma modulators"; IEEE International Symposium on Circuits and Systems; 1995.

PCT Application No. PCT/US2010/021966; Search Report and Written Opinion dated Aug. 31, 2010.

* cited by examiner

CONTINUOUS-TIME SIGMA-DELTA MODULATOR WITH MULTIPLE FEEDBACK PATHS HAVING INDEPENDENT DELAYS

TECHNICAL FIELD

Embodiments of the subject matter described herein relate generally to mixed-signal circuits, and more particularly, embodiments of the subject matter relate to continuous-time sigma-delta modulators.

BACKGROUND

In many modern electronics applications, it is desirable to convert an analog signal to a digital value. For example, in a radio frequency (RF) transceiver, a received analog RF signal may be demodulated to an analog baseband signal which is then converted to a digital baseband signal for subsequent digital signal processing. Many electrical systems utilize analog-to-digital converters (ADCs) to convert an analog signal to a digital value. However, because of the finite nature of digital representation, quantization error (which is the difference between the actual analog value and quantized digital value due to rounding or truncation) is an imperfection inherent to the analog-to-digital conversion. In some ADCs, sigma-delta modulation (or alternatively, delta-sigma modulation) is used to reduce the effect of quantization error and improve signal-to-noise ratio (SNR). Sigma-delta modulation (alternatively referred to as delta-sigma modulation) adds or subtracts quantization error to a forward signal path using feedback loops and integrator circuits. The quantization error is oversampled at a frequency greater than the analog input signal frequency, thereby allowing it to be filtered at the integrators without noticeably impacting the signal.

Many systems utilize continuous-time sigma-delta modulators, that is, sigma-delta modulators constructed using continuous-time circuitry. Continuous-time sigma-delta modulators can be clocked at higher sampling frequencies which improves the performance of the sigma-delta modulator. In practice, however, high-speed sigma-delta modulators (generally sigma-delta modulators with sampling frequencies in the MHz range or higher) exhibit delay, referred to as excess loop delay, which can lead to instability and degrade performance (e.g., SNR) of the modulator. The loop delay results from, for example, the nonzero switching time of transistors and/or comparators utilized in the quantizer and/or digital-to-analog converter (DAC). As a result, there is a nonzero delay between a change at the quantizer output and the corresponding response at the output of the DACs in the main feedback path. The loop delay is further compounded by other factors, such as, for example, metastability in the comparators (or other components) and/or dynamic element matching. While the loop delay may be reduced with improvements to the hardware and/or electrical components, such improvements generally come at the cost of increased power consumption and larger area requirements, both of which are undesirable.

If the DAC in the feedback path of the modulator uses a return-to-zero (RZ) pulse scheme, the sigma-delta modulator may compensate for loop delay by adjusting the gain coefficients in the main feedback path. However, most systems utilize a no-return-to-zero (NRZ) pulse scheme for the main feedback path because NRZ pulses provide better immunity to clock jitter than RZ pulses. In the case of a NRZ pulse scheme, it is not possible to compensate for the loop delay by only adjusting the gain coefficients in the main feedback path.

Many prior art systems that utilize a NRZ pulse scheme attempt to mitigate the effects of loop delay by purposely inserting a constant delay in the main feedback path of the sigma-delta modulator and compensating for the constant delay with an additional term in the modulator transfer function. In some systems, an additional feedback path is inserted before the quantizer input and the gain coefficient of the DAC in the additional feedback path is adjusted to compensate for the constant delay. However, this increases the voltage swing at the output of the integrator preceding the quantizer. To offset this voltage swing, the overall gain of the modulator must be reduced, thereby reducing SNR. In addition, this approach creates a summing junction at the input of the quantizer. In order to process the high frequency signals present at the summing junction, the summing junction is often realized using an analog summer (e.g., a high-speed summing amplifier) which increases the power and area requirements for the modulator.

In order to avoid the use of a high-speed analog summer, some systems utilize digital differentiation to move the additional feedback path from the input of the quantizer to the input of the integrator that precedes the quantizer. While this eliminates the analog summer and reduces the voltage swing at the output of the integrator, the digital differentiation results in a bipolar RZ pulse at the input of the integrator. This causes the output of the integrator to move in the wrong direction during the first half of the clock period before switching direction in the second half of the clock period, resulting in a large slew rate requirement for the integrator. To satisfy the slew rate requirement, the integrator consumes additional power and area, which offsets the power and area saving from eliminating the analog summer. Other systems utilize proportional-integral (PI) compensation or other techniques which degrade the frequency response of the integrator and may lead to out-of-band peaking and other undesirable effects.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
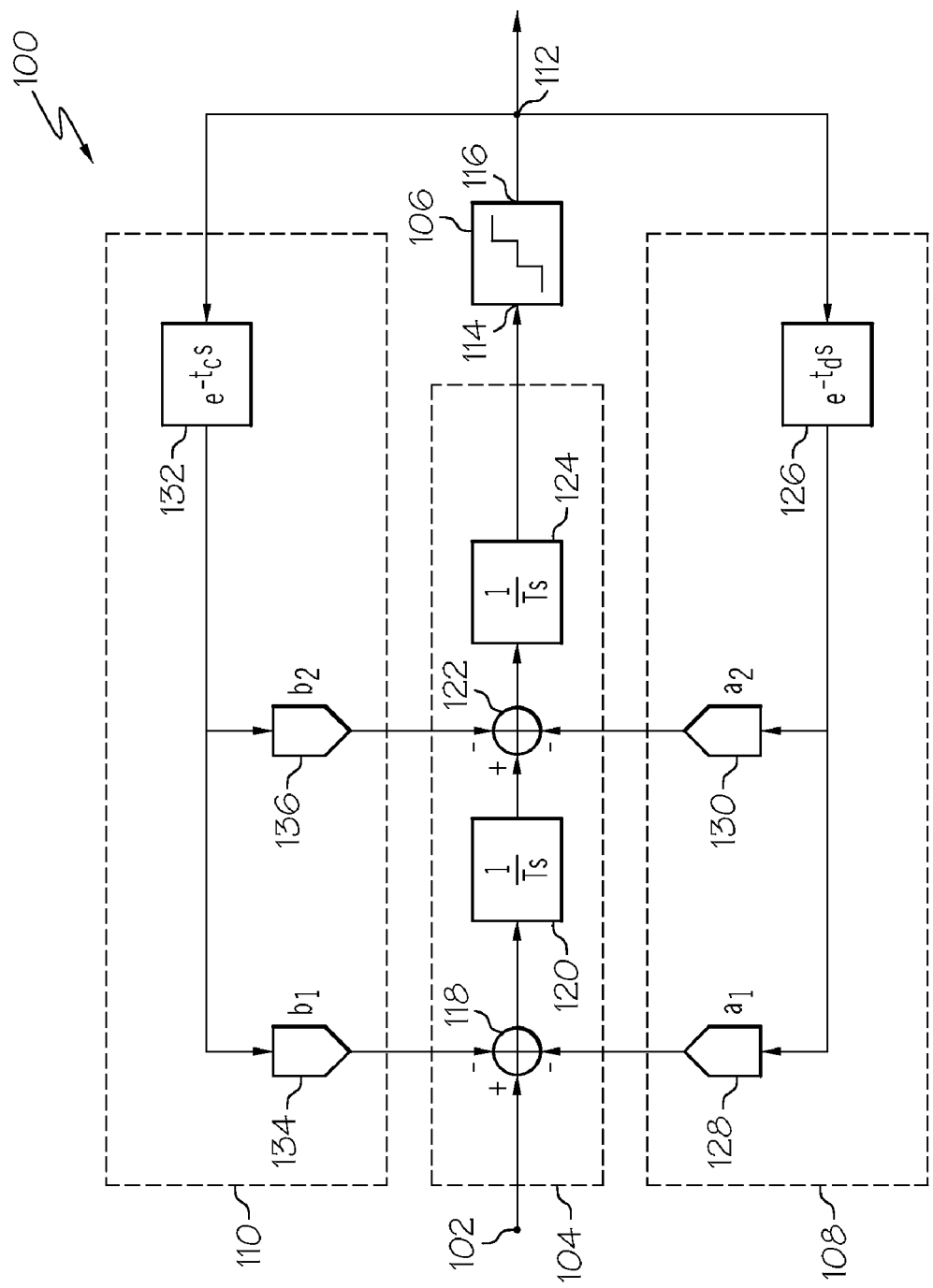
FIG. 1 is a block diagram of a sigma-delta modulator in accordance with one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the following description for the purpose of reference only, and thus are not intended to be limiting. For example, terms such as "first", "second" and other such numerical terms referring to structures do not imply a sequence or order unless clearly indicated by the context.

For the sake of brevity, conventional techniques related to signal processing, sampling, analog-to-digital conversion, digital-to-analog conversion, analog circuit design, differential circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

Technologies and concepts discussed herein relate to systems and methods for compensating for an intentional delay inserted in the main feedback path in a continuous-time sigma-delta modulator. A compensation feedback path is implemented with a different delay than the delay in the main feedback path, and the delay in the compensation feedback path is independent of the delay in the main feedback path. The compensation feedback path may each be implemented using non-return-to-zero (NRZ) digital-to-analog converters (DACs), and the gain coefficients of the DACs and the delay in the compensation feedback path may be adjusted to relax slew-rate requirements for analog components and eliminate the need for a high-speed analog summing junction (or analog summer) before the input of the quantizer. As a result, the area, power, cost and design time of the sigma-delta modulator are reduced without sacrificing the performance of the modulator.

FIG. 1 depicts an exemplary embodiment of a sigma-delta modulator 100 suitable for use in an analog-to-digital converter (ADC) or another analog-to-digital conversion application. In an exemplary embodiment, the sigma-delta modulator 100 is realized as a continuous-time sigma-delta modulator comprising suitably configured continuous-time circuitry. The sigma-delta modulator 100 may include, without limitation, an input node 102 for receiving an input signal, a forward signal arrangement 104 configured to establish a forward signal path, a quantizer 106, a main feedback arrangement 108 configured to establish a main feedback signal path, a compensation feedback arrangement 110 configured to establish a compensation feedback signal path, and a digital output 112. The elements of the sigma-delta modulator 100 are suitably configured to produce a digital value at the digital output 112 that is representative of an analog input signal at the input node 102.

It should be understood that FIG. 1 is a simplified diagram of the sigma-delta modulator 100 depicted in single-ended form, and practical embodiments of the sigma-delta modulator 100 may include additional or alternative components, and/or be implemented in a differential manner (e.g., as a differential circuit adapted for differential input signals). In this regard, the sigma-delta modulator 100 may be configured for single-bit operation or multi-bit operation, depending on the particular needs of a given application. It should also be understood that FIG. 1 depicts a second-order feedback sigma-delta modulator 100 for purposes of explanation, and the subject matter described herein is not intended to be limited to any particular sigma-delta topology. The subject matter can be adapted for a forward signal arrangement 104 having any order, and may be implemented using any suitable sigma-delta topology, as will be appreciated in the art.

In an exemplary embodiment, the input node 102 is coupled to the forward signal arrangement 104 which, in turn, is coupled to the analog input 114 of the quantizer 106. The quantizer 106 converts an analog signal at the quantizer input 114 to a digital value at the quantizer output 116 which, in turn, is coupled to the digital output 112. The main feedback arrangement 108 (or main feedback path) comprises a combination of functional, hardware, and/or logical elements coupled between the digital output 112 and the forward signal arrangement 104, wherein the main feedback arrangement 108 defines a feedback signal path for one or more main feedback signals, as described in greater detail below. In an exemplary embodiment, the main feedback arrangement 108 is configured to delay the digital value at the digital output 112 by a first delay period ($t_d$) and generate one or more main feedback signals based on the delayed value. It should be noted that the main feedback arrangement 108 provides at least a first main feedback signal at the input of the sigma-delta modulator 100, that is, the main feedback arrangement 108 includes at least one feedback path coupled to the input node 102 as described below. The compensation feedback arrangement 110 (or compensation feedback path) comprises a combination of functional, hardware, and/or logical elements coupled between the digital output 112 and the forward signal arrangement 104, wherein the compensation feedback arrangement 110 defines a feedback signal path for one or more compensation feedback signals. As described in greater detail below, the compensation feedback path 110 is configured to delay the digital value at the digital output 112 by a second delay period ($t_c$) and generate one or more compensation feedback signals based on the delayed value. The forward signal arrangement 104 (or forward signal path) comprises a combination of functional, hardware, and/or logical elements which are suitably configured to produce the analog signal at the quantizer input 114 based on the input signal at the input node 102, the main feedback signals from the main feedback arrangement 108, and the compensation feedback signals from the compensation feedback arrangement 110. In this regard, the first delay period ($t_d$) represents an intentional delay inserted into the main feedback arrangement 108 to compensate for the loop delay caused by the analog components of the sigma-delta modulator 100. The second delay period ($t_c$) represents a delay used to create compensation feedback signals that compensate for the difference between the value of the first delay period and the actual loop delay exhibited by the analog components of the sigma-delta modulator 100.

Depending on the embodiment, the forward signal path 104 may be realized with any order and using any suitable sigma-delta circuit topology, such as, for example, a lowpass topology, a bandpass topology, a highpass topology, a feedback topology, a feedforward topology, a feedforward-feedback topology or another hybrid topology, a cascade topology, a quadrature or complex topology, and the like. As shown in FIG. 1, in accordance with one embodiment, the forward signal path 104 is realized as a second-order sigma-delta feedback topology including, without limitation, a first summing junction 118, a first integrator 120, a second summing junction 122, and a second integrator 124. The first summing junction 118 is coupled between the input node 102 and the input of the first integrator 120. The second summing junction 122 is coupled between the output of the first integrator 120 and the input of the second integrator 124. The output of the second integrator 124 is connected to the quantizer input 114 and the second integrator 124 produces an analog signal at the quantizer input 114.

In an exemplary embodiment, the quantizer 106 is configured to generate a digital value at the quantizer output 116 that comprises one or more bits which are representative of the analog signal (or analog voltage level) at the quantizer input 114. The quantizer 106 generates the digital value at by sampling the analog signal at the quantizer input 114 with a particular sampling frequency ($f_s$). For example, a continuous-time sigma-delta modulator 100 used in a communications application may have a sampling frequency ranging from the tens of MHz to hundreds of MHz. In accordance with one or more embodiments, the sampling frequency of the quantizer 106 ranges from about 200 MHz to about 400 MHz or more. However, it will be appreciated in the art that the sampling frequency of the quantizer 106 will vary depending on the needs of a particular application (e.g., the desired effective number of bits). In this regard, the sampling period or sampling interval (e.g., the time between samples) is the inverse of the sampling frequency $$\left(\frac{1}{f_s}\right).$$

Depending on the embodiment, the quantizer 106 may utilize a flash analog-to-digital conversion architecture or another suitable conversion architecture, and may be configured for any number of output bits or any noise shaping. In an exemplary embodiment, there is a non-zero delay between the time of an input signal change at the quantizer input 114 and the time at which the digital value at the quantizer output 116 changes in response to the input signal change. For example, if the quantizer 106 is realized as a differential flash ADC, the preamplifiers and/or comparators within the quantizer 106 may exhibit a non-zero rise time and/or a non-zero settling time.

In an exemplary embodiment, the main feedback path 108 includes a main feedback delay element 126 and at least one digital-to-analog converter (DAC) 128, 130. The input of the main feedback delay element 126 is connected to the digital output 112 (or quantizer output 116) and the main feedback delay element 126 is configured to delay the digital value at the digital output 112 by the first delay period ($t_d$). As set forth above, the first delay period represents an intentional delay inserted into the main feedback path 108 which is intended to compensate for the loop delay of the sigma-delta modulator 100 (e.g., the delays introduced by the forward signal path 104, the quantizer 106, and/or DACs 128, 130). In this regard, the first delay period may be any arbitrary time period between zero and length of one sampling period (e.g., $$\frac{1}{f_s}\right).$$

In an exemplary embodiment, the first delay period is intended to absorb the loop delay of the sigma-delta modulator 100, that is, the value of the first delay period is greater than or equal to the actual delay associated with the analog components of the modulator 100. In an exemplary embodiment, the main feedback delay element 126 is realized as a digital delay element, such as, for example, a flip-flop, a latch, and the like). Various implementation aspects of delaying a signal are well known, and as such, will not be described in detail herein.

In an exemplary embodiment, the main feedback DACs 128, 130 are each realized as a NRZ DAC that uses a NRZ pulse scheme to generate the respective feedback signal, such that the respective feedback signal generated by the DAC 128, 130 is substantially constant (e.g., within practical and/or realistic operating tolerances) for the duration of the sampling period. It should be noted, however, that in alternative embodiments, the main feedback DACs 128, 130 may be realized using return-to-zero (RZ) DACs or DACs having non-square or non-rectangular waveforms (e.g., DACs with a damping exponential waveform). The first DAC 128 has a digital input connected to the output of the main feedback delay element 126 and an analog output coupled to the input node 102, that is, the input of the sigma-delta modulator 100. In this regard, the analog output of the first DAC 128 is connected to the first summing junction 118. The first DAC 128 generates a first main feedback signal at the input of the sigma-delta modulator 100 (e.g., at the first summing junction 118) by converting the digital value at the output of the main feedback delay element 126 (e.g., the digital value at the digital output 112 which has been delayed by the first delay period) into an analog signal with a first gain coefficient ($a_1$). In the illustrated embodiment, the second DAC 130 has a digital input connected to the output of the main feedback delay element 126 and an analog output connected to the second summing junction 122. The second DAC 130 generates a second main feedback signal at the second summing junction 122 by converting the digital value at the output of the main feedback delay element 126 into an analog signal with a second gain coefficient ($a_2$).

In an exemplary embodiment, the compensation feedback path 110 includes a compensation feedback delay element 132 and at least one DAC 134, 136. The input of the compensation feedback delay element 132 is connected to the digital output 112 (or quantizer output 116) and the compensation feedback delay element 132 is configured to delay the digital value at the digital output 112 by the second delay period ($t_c$). As set forth above, the second delay period represents a delay inserted into the compensation feedback path 110 which is intended to compensate for the effect of the excess loop delay resulting from the first delay period. In this regard, the length of time of the second delay period may be chosen to be any arbitrary time period between zero and length of one sampling period (e.g., $$\frac{1}{f_s}$$

where $f_s$ is the sampling frequency). The second delay period is preferably chosen to be greater than the excess loop delay, and is different than the first delay period, as described in greater detail below. The compensation feedback delay element 132 is preferably realized as a digital delay element as described above in the context of main feedback delay element 126. The first DAC 134 of the compensation feedback path 110 has a digital input connected to the output of the compensation feedback delay element 132 and an analog output connected to the first summing junction 118. The first DAC 134 generates a first compensation feedback signal at the first summing junction 118 by converting the digital value at the output of the compensation feedback delay element 132 (e.g., the digital value at the digital output 112 which has been delayed by the second delay period) into an analog signal with a third gain coefficient ($b_1$). The second DAC 136 of the compensation feedback path 110 has a digital input connected to the output of the compensation feedback delay element 132 and an analog output connected to the second summing junction 122, wherein the second DAC 136 generates a second compensation feedback signal at the second summing junction 122 by converting the digital value at the output of the compensation feedback delay element 132 into an analog signal with a fourth gain coefficient ($b_2$). In an exemplary embodiment, the compensation DACs 134, 136 are realized as NRZ DACs, although in alternative embodiments, the compensation DACs 134, 136 may be realized as return-to-zero (RZ) DACs, as described in greater detail below. In accordance with one or more embodiments, the compensation DACs 134, 136 may also be realized using DACs having non-square or non-rectangular waveforms (e.g., DACs with a damping exponential waveform).

For the second-order feedback modulator 100 shown in FIG. 1, the first summing junction 118 is configured to subtract the first main feedback signal (from DAC 128) and the first compensation feedback signal (from DAC 134) from the input signal at the input node 102 and provide the result to input of the first integrator 120. The first integrator 120 integrates the resultant signal at the first summing junction 118 in a conventional manner, as will be appreciated in the art. The second summing junction 122 is configured to subtract the second main feedback signal (from DAC 130) and the second compensation feedback signal (from DAC 136) from the output of the first integrator 120 and provide the result to the second integrator 124. The second integrator 124 integrates the resultant signal at the second summing junction 122 to produce the analog signal at the quantizer input 114. Depending on the embodiment, each integrator 120, 124 may be realized using active circuitry components, passive circuitry components, or a suitable combination thereof. In this manner, the analog signal at the quantizer input 114 is based on the input signal, the main feedback signals, and the compensation feedback signals. It should be appreciated that although FIG. 1 depicts multiple DACs 134, 136 in the compensation feedback path 110 for producing multiple compensation feedback signals, in practice, only a single compensation feedback signal is needed to compensate for the intentional delay ($t_d$) inserted in the main feedback path 108, as described in greater detail below. However, the use of additional compensation feedback signals as shown in FIG. 1 offers additional degrees of freedom which may be utilized to adjust operating parameters for various components in the forward signal path 104. For example, the voltage swing or slew rate for an integrator 120, 124 may be adjusted by varying the gain coefficients in the compensation feedback path.

It should be noted that in an exemplary embodiment, by virtue of the separate compensation feedback path 110, the second delay period is structurally independent of the first delay period, that is, the second delay period is not influenced by the first delay period and the first delay period is not influenced by the second delay period. Notably, in the illustrated embodiment, the delay elements 126, 132 are in distinct feedback paths and are not cascaded (or non-cascaded) or otherwise interconnected, for example, the output of one delay element does not feed the input of another. In this manner, the first delay period and the second delay period are uncorrelated as the second delay period is not influenced or affected by the components and/or embedded delays in the main feedback path 108 and the first delay period is not influenced or affected by the components and/or embedded delays in the compensation feedback path 110. In an exemplary embodiment, the first delay period and the second delay period are not equal. In other words, the value of the second delay period is not chosen to be equal to the first delay period or vice versa. Preferably, the first delay period and the second delay period are each chosen to be a value greater than the actual loop delay of the analog components of the modulator 100. Depending on the embodiment, the second delay period may be less than the first delay period or greater than the first delay period, as described in greater detail below.

Figure 2:
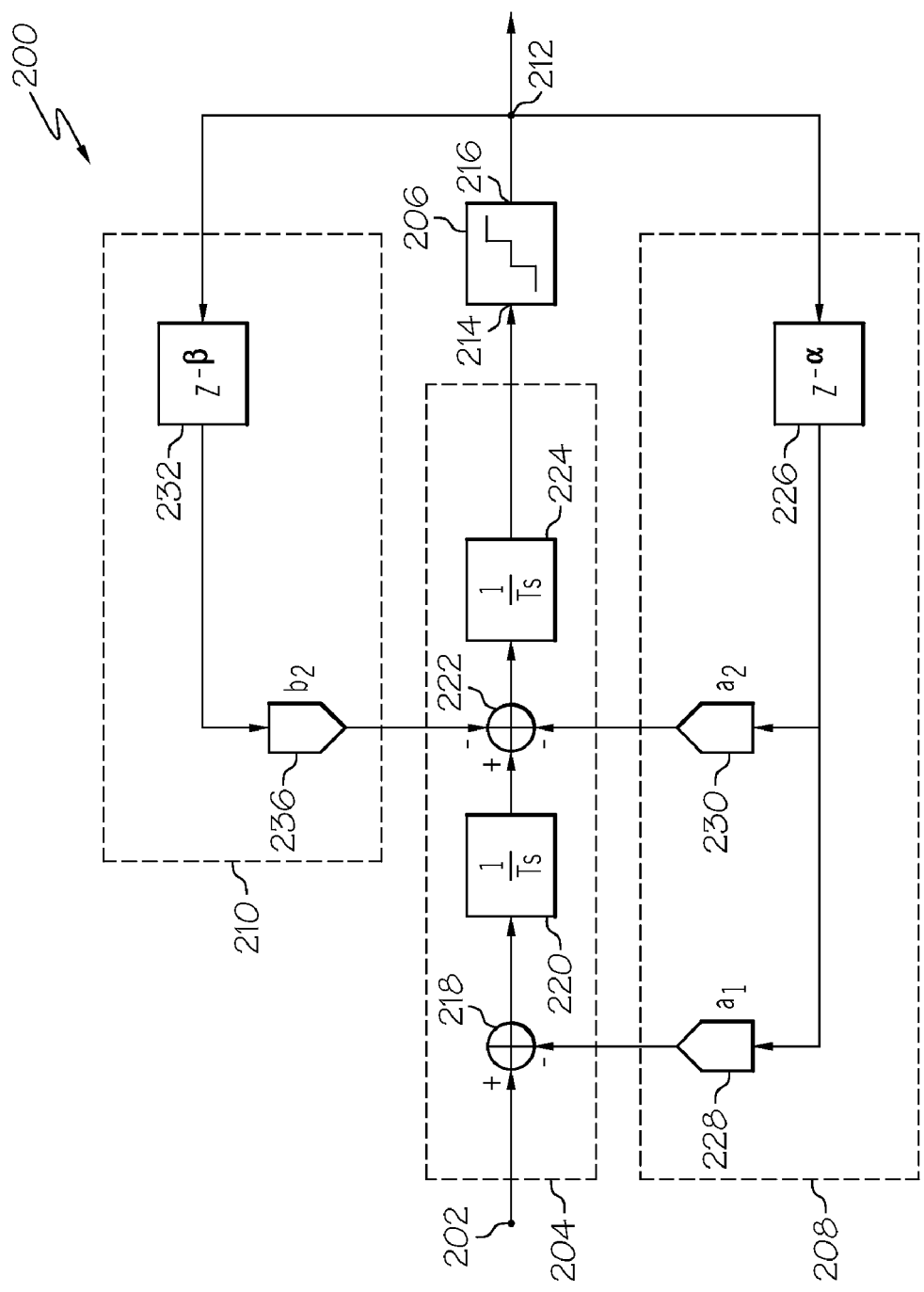
FIG. 2 is a block diagram of a sigma-delta modulator in accordance with another embodiment.

FIG. 2 depicts a sigma-delta modulator 200 in accordance with another embodiment. The sigma-delta modulator 200 is realized as a continuous-time sigma-delta modulator including, without limitation, an input node 202 for receiving an input signal, a forward signal arrangement 204 (or forward signal path), a quantizer 206, a main feedback arrangement 208 (or main feedback path), a compensation feedback arrangement 210 (or compensation feedback path), and a digital output 212. The elements of the sigma-delta modulator 200 are similar to counterpart elements discussed above in the context of sigma-delta modulator 100 of FIG. 1, and as such, these common elements will not be redundantly described in detail here in the context of FIG. 2. In the illustrated embodiment of FIG. 2, the main feedback delay element 226 and the compensation feedback delay element 232 are each realized as a digital delay element, wherein the associated delay periods are represented in the Z-domain, as will be appreciated in the art. In addition, the compensation feedback path 210 is realized using a single DAC 236 which provides a single compensation feedback signal to the forward signal path 204.

Figure 3:
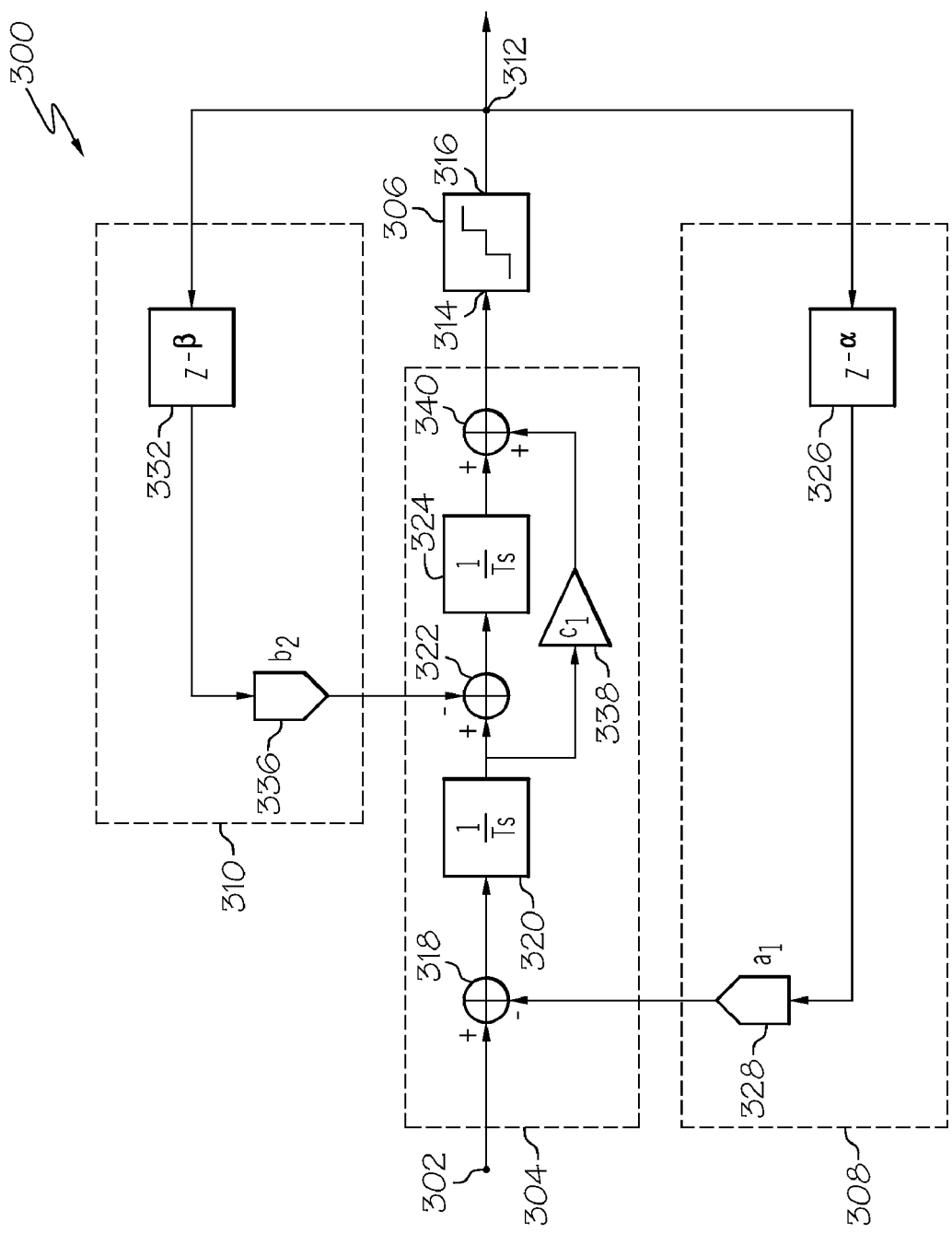
FIG. 3 is a block diagram of a sigma-delta modulator in accordance with yet another embodiment.

FIG. 3 depicts a sigma-delta modulator 300 in accordance with another embodiment. The sigma-delta modulator 300 is realized as a continuous-time sigma-delta modulator having a feedforward topology. The sigma-delta modulator 300 includes, without limitation, an input node 302 for receiving an input signal, a forward signal arrangement 304 (or forward signal path), a quantizer 306, a main feedback arrangement 308 (or main feedback path), a compensation feedback arrangement 310 (or compensation feedback path), and a digital output 312. Various elements of the sigma-delta modulator 300 are similar to counterpart elements discussed above in the context of sigma-delta modulator 100 of FIG. 1, and as such, these common elements will not be redundantly described in detail here in the context of FIG. 3.

As shown in FIG. 3, the forward signal path 304 is realized as a feedforward sigma-delta topology including, without limitation, a first summing junction 318, a first integrator 320, a second summing junction 322, a second integrator 324, an amplifier 338, and a third summing junction 340. The first summing junction 318 is connected between the input node 302 and the input of the first integrator 320. The first summing junction 318 is configured to subtract the main feedback signal (from DAC 328) from the input signal at the input node 302 and provide the result to input of the first integrator 320 which integrates the resultant signal at the first summing junction 318 in a conventional manner. The second summing junction 322 is connected between the output of the first integrator 320 and the input of the second integrator 324. The second summing junction 122 is configured to subtract the compensation feedback signal (from DAC 336) from the output of the first integrator 320 and provide the result to the input of the second integrator 324. The output of the first integrator 320 is also connected to an input of the amplifier 338, and the output of the amplifier 338 is connected to the third summing junction 340. The amplifier 338 amplifies the output of the first integrator 320 by a gain factor ($c_1$) and provides the result to the third summing junction 340. The output of the second integrator 324 is also connected to the third summing junction 340. The third summing junction 340 is configured to add the output of the second integrator 324 and the amplified output of the first integrator 320 (e.g., via amplifier 338) to produce the analog signal at the quantizer input 314. In this manner, the analog signal at the quantizer input 314 is based on the input signal, the main feedback signal, and the compensation feedback signal. In this embodiment, by virtue of using an NRZ DAC 336, there are smaller voltage variations at the input of the second integrator 324, and as a result, the slew rate requirement for the second integrator 324 is relaxed compared to an integrator with a bipolar RZ feedback pulse at its input. Furthermore, although not a requirement, if the third summing junction 340 is realized as a summing amplifier (or analog summer), the speed requirement (e.g., the gain-bandwidth for small-signal implementations, slew-rate for large-signal implementations) of the summing amplifier is relaxed by virtue of only two signals being present at the third summing junction 340.

Referring now to FIGS. 1-3, the sigma-delta modulator 100, 200, 300 may achieve any desired noise transfer function using NRZ compensation feedback signals. Furthermore, it should be noted that any desired noise transfer function may be achieved using only a single DAC in the compensation feedback path. In accordance with one embodiment, the second delay period (e.g., $t_c$ or $\beta$) may be less than the first delay period (e.g., $t_d$ or $\alpha$). For example, the first delay period may be chosen to be equal to one sample (e.g., $\alpha=1$, or alternatively $$t_d = \frac{1}{f_s}\bigg)$$

and the second delay period may be chosen to be equal to a half sample (e.g., $\beta=\frac{1}{2}$ or alternatively $$t_c = \frac{1}{2f_s}\bigg).$$

Referring to FIG. 2, assuming a desired noise transfer function of $(1-z^{-1})^2$, the sigma-delta modulator 200 may provide the desired noise transfer function with a single compensation feedback signal (i.e., only a single DAC 236 in the compensation feedback path 210). In this regard, the sigma-delta modulator 200 achieves the noise transfer function of $(1-z^{-1})^2$ with a gain coefficient for the first main feedback DAC 228 (e.g., the first main feedback signal) of $a_1=1$, a gain coefficient for the second main feedback DAC 230 (e.g., the second main feedback signal) of $a_2=-1.5$, and a gain coefficient of the compensation feedback DAC 228 (e.g., the compensation feedback signal) of $b_2=4$. Referring to FIG. 3, the sigma-delta modulator 300 achieves the noise transfer function of $(1-z^{-1})^2$ using only a single compensation feedback DAC 332, with a gain coefficient for the main feedback DAC 328 (e.g., the main feedback signal) of $a_1=1$, a gain coefficient for the compensation feedback DAC 336 (e.g., the compensation feedback signal) of $b_2=4$, and a gain factor for the amplifier 338 of $c_1=-1.5$.

Referring again to FIGS. 1-3, in accordance with another embodiment, the delay periods in the feedback paths may be adjusted by an offset delay, with the offset delay being allocated to analog components in the forward signal path and/or quantizer. In this regard, the offset delay represents a settling time margin which may be allocated to the analog components, thereby allowing them to be designed for a lower speed to save power. For example, referring to FIG. 2, the delay periods of the feedback paths 208, 210 may adjusted by an offset delay of a quarter sample (or $$\frac{1}{4f_s}\bigg),$$

which has been identified as the optimal settling time for designing the analog components in the forward signal path 204. The offset delay is then allocated to analog components in the forward signal path 204 and/or quantizer 206, such as, for example, the integrators 220, 224 or preamplifiers within the quantizer 206. The delay periods for the feedback paths 208, 210 are adjusted by subtracting the offset delay, such that the first delay period is equal to three-quarters of a sample (e.g., $\alpha=\frac{3}{4}$) and the second delay period is equal to a quarter sample (e.g., $\beta=\frac{1}{4}$). The gain coefficients for the DACs 228, 230, 236 remain the same (e.g., $a_1=1$, $a_2=-1.5$, $b_2=4$) provided that the total loop delay of the sigma-delta modulator 200 is unchanged.

Referring again to FIGS. 1-3, in accordance with another embodiment, the second delay period may be greater than the first delay period. For example, referring again to FIG. 2, the sigma-delta modulator 200 may achieve the desired noise transfer function of $(1-z^1)^2$ with the first delay period being equal to a half sample (e.g., $\alpha=\frac{1}{2}$) and the second delay period being equal to a full sample (e.g., $\beta=1$). In this regard, the sigma-delta modulator 200 achieves the desired noise transfer function with a gain coefficient for the first main feedback DAC 228 of $a_1=1$, a gain coefficient for the second main feedback DAC 230 of $a_2=3.75$, and a gain coefficient of the compensation feedback DAC 228 of $b_2=-1.75$.

Referring again to FIGS. 1-3, in accordance with another embodiment, the sigma-delta modulator may also achieve a desired noise transfer function using NRZ main feedback signals with a single RZ compensation feedback signal. For example, referring again to FIG. 2, in accordance with one embodiment, the compensation feedback DAC 236 may be realized as a RZ DAC that uses a RZ pulse scheme to generate the compensation feedback signal, such that the compensation feedback signal generated by the DAC 236 is substantially constant (e.g., within practical and/or realistic operating tolerances) for the duration of one half of the sampling period. In this regard, the use of the RZ compensation feedback signal results in increased voltage steps at the input of the integrator 224 relative to the voltage steps experienced when a NRZ compensation feedback signal is used. However, the RZ compensation feedback signal still results in a more relaxed slew rate requirement for the second integrator 224 when compared to an equivalent bipolar RZ compensation scheme.

One advantage of the systems and/or methods described above is that NRZ feedback signals may be used to compensate for excess loop delay resulting from the intentional delay inserted in the main feedback loop for a sigma-delta modulator. The NRZ feedback signals may be implemented in a manner that provides multiple degrees of freedom, which may be utilized to vary the delay and/or gain coefficients for the main feedback signals and the compensation feedback signals to relax slew-rate requirements for integrators and/or amplifiers or eliminate the need for a high-speed analog summing junction (or analog summer). As a result, the area, power, cost and design time of the sigma-delta modulator are reduced without sacrificing the performance of the modulator.

In summary, systems, devices, and methods configured in accordance with example embodiments of the subject matter relate to:

An apparatus is provided for a sigma-delta modulator. In an exemplary embodiment, the sigma-delta modulator comprises an input node for receiving an input signal and a quantizer configured to convert a first analog signal to a digital value. A main feedback arrangement is coupled to the quantizer and is configured to delay the digital value by a first delay period to obtain a first delayed value and generate a main feedback signal based on the first delayed value. A compensation feedback arrangement is coupled to the quantizer and configured to delay the digital value by a second delay period to obtain a second delayed value and generate a compensation feedback signal based on the second delayed value. A forward signal arrangement is coupled between the input node and the quantizer, the forward signal arrangement being coupled to the main feedback arrangement and the compensation feedback arrangement. The forward signal arrangement produces the first analog signal at the quantizer based on the input signal, the main feedback signal, and the compensation feedback signal. The second delay period is not influenced by the first delay period and the compensation feedback signal compensates for the first delay period.

In accordance with one embodiment, the compensation feedback arrangement comprises a non-return-to-zero digital-to-analog converter configured to generate the compensation feedback signal. In another embodiment, the compensation feedback arrangement comprises a return-to-zero digital-to-analog converter configured to generate the compensation feedback signal. In yet another embodiment, the second delay period is not equal to the first delay period. In accordance with another embodiment, the main feedback arrangement comprises a first non-return-to-zero digital-to-analog converter configured to generate the main feedback signal and the compensation feedback arrangement comprises a second non-return-to-zero digital-to-analog converter configured to generate the compensation feedback signal. In a further embodiment, the main feedback arrangement generates the main feedback signal with a first gain and the compensation feedback arrangement generates the compensation feedback signal with a second gain, wherein the magnitude of the second gain is not equal to the magnitude of the first gain. In accordance with yet another embodiment, the main feedback arrangement comprises a non-return-to-zero digital-to-analog converter configured to generate the main feedback signal and the compensation feedback arrangement comprises a return-to-zero digital-to-analog converter configured to generate the compensation feedback signal. In another embodiment, the forward signal arrangement comprises a circuit topology selected from a group consisting of a lowpass topology, a bandpass topology, a highpass topology, a feedback topology, a feedforward topology, a mixed feedforward-feedback topology, a cascade topology, a quadrature topology, and a complex topology.

In accordance with another embodiment, an apparatus for an analog-to-digital converter is provided. The analog-to-digital converter comprises an input node for receiving an input signal and a quantizer configured to convert a first analog signal to a digital value. A forward signal path is coupled between the input node and the quantizer. A first delay element is coupled to the quantizer, and the first delay element is configured to delay the digital value by a first delay period resulting in a first delayed value. A first digital-to-analog converter is coupled between the first delay element and the forward signal path, and the first digital-to-analog converter generates a first feedback signal based on the first delayed value. A second delay element is coupled to the quantizer, and the second delay element is configured to delay the digital value by a second delay period resulting in a second delayed value. The first delay element and the second delay element are non-cascaded, such that the first delay period and the second delay period are uncorrelated. A second digital-to-analog converter is coupled between the second delay element and the forward signal path, and the second digital-to-analog converter generates a second feedback signal based on the second delayed value. The forward signal path produces the first analog signal at the quantizer based on the input signal, the first feedback signal, and the second feedback signal, such that the second feedback signal compensates for the first delay period.

In accordance with one embodiment, the first digital-to-analog converter generates the first feedback signal with a first gain and the second digital-to-analog converter generates the second feedback signal with a second gain, wherein the second gain is not equal to the first gain. In another embodiment, the second digital-to-analog converter comprises a non-return-to-zero digital-to-analog converter. In yet another embodiment, the second digital-to-analog converter comprises a return-to-zero digital-to-analog converter. In yet another embodiment, the second delay period is less than the first delay period. In accordance with yet another embodiment, the second delay period is greater than the first delay period. In another embodiment, the forward signal path comprises a circuit topology selected from a group consisting of a lowpass topology, a bandpass topology, a highpass topology, a feedback topology, a feedforward topology, and a mixed feedforward-feedback topology.

In another embodiment, an apparatus for a sigma-delta modulator is provided. The sigma-delta modulator comprises an input node for receiving an input signal and first integrator having a first input coupled to the input node and a first output. A quantizer has a quantizer input coupled to the first output, wherein the quantizer is configured to convert a first analog signal at the quantizer input to a digital value at a quantizer output. A first delay element is coupled to the quantizer output, and the first delay element is configured to delay the digital value by a first delay period resulting in a first delayed value. A first digital-to-analog converter is coupled between the first delay element and the first input, and the first digital-to-analog converter converts the first delayed value to a first analog value at the first input. A second delay element is coupled to the quantizer output, and the second delay element is configured to delay the digital value by a second delay period resulting in a second delayed value. The second delay period is not equal to the first delay period and the second delay period is independent of the first delay period. A second digital-to-analog converter is coupled between the second delay element and the first input, and the second digital-to-analog converter converts the second delayed value to a second analog value at the first input. In accordance with one embodiment, the sigma-delta modulator further comprises a second integrator coupled between the input node and the first integrator. The second integrator has a second input coupled to the input node and a second output coupled to the first input. A third digital-to-analog converter is coupled between the first delay element and the second input, and the third digital-to-analog converter converts the first delayed value to a third analog value at the second input. In a further embodiment, the second delay period is less than the first delay period. In accordance with one embodiment, the quantizer has a sampling period associated therewith, wherein the second delay period is equal to one half of the sampling period and the first delay period is equal to the sampling period. In accordance with yet another embodiment, the second delay period is equal to one quarter of the sampling period and the first delay period is equal to three quarters of the sampling period.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A sigma-delta modulator comprising:
   an input node for receiving an input signal;
   a quantizer configured to convert a first analog signal to a digital value;
   a main feedback arrangement coupled to the quantizer, the main feedback arrangement being configured to:
      delay the digital value by a first delay period to obtain a first delayed value; and
      generate a main feedback signal based on the first delayed value;
   a compensation feedback arrangement coupled to the quantizer, the compensation feedback arrangement being configured to:
      delay the digital value by a second delay period to obtain a second delayed value, wherein the second delay period is not equal to the first delay period and the second delay period is not influenced by the first delay period; and
      generate a compensation feedback signal based on the second delayed value; and
   a forward signal arrangement coupled between the input node and the quantizer, the forward signal arrangement being coupled to the main feedback arrangement and the compensation feedback arrangement, wherein:
      the forward signal arrangement produces the first analog signal based on the input signal, the main feedback signal, and the compensation feedback signal; and
      the compensation feedback signal compensates for the first delay period.

2. The sigma-delta modulator of claim 1, wherein the compensation feedback arrangement comprises a non-return-to-zero digital-to-analog converter configured to generate the compensation feedback signal.

3. The sigma-delta modulator of claim 1, wherein the compensation feedback arrangement comprises a return-to-zero digital-to-analog converter configured to generate the compensation feedback signal.

4. The sigma-delta modulator of claim 1, wherein the forward signal arrangement comprises a circuit topology selected from a group consisting of a lowpass topology, a bandpass topology, a highpass topology, a feedback topology, a feedforward topology, a mixed feedforward-feedback topology, a cascade topology, a quadrature topology, and a complex topology.

5. The sigma-delta modulator of claim 1, wherein:
   the main feedback arrangement comprises a first non-return-to-zero digital-to-analog converter configured to generate the main feedback signal; and
   the compensation feedback arrangement comprises a second non-return-to-zero digital-to-analog converter configured to generate the compensation feedback signal.

6. The sigma-delta modulator of claim 5, wherein the main feedback arrangement generates the main feedback signal with a first gain and the compensation feedback arrangement generates the compensation feedback signal with a second gain, wherein a magnitude of the second gain is not equal to a magnitude of the first gain.

7. The sigma-delta modulator of claim 1, wherein:
   the main feedback arrangement comprises a non-return-to-zero digital-to-analog converter configured to generate the main feedback signal; and
   the compensation feedback arrangement comprises a return-to-zero digital-to-analog converter configured to generate the compensation feedback signal.

8. An analog-to-digital converter comprising:
   an input node for receiving an input signal;
   a quantizer configured to convert a first analog signal to a digital value;
   a forward signal path coupled between the input node and the quantizer;
   a first delay element coupled to the quantizer, the first delay element being configured to delay the digital value by a first delay period resulting in a first delayed value;
   a first digital-to-analog converter coupled between the first delay element and the forward signal path, the first digital-to-analog converter being configured to generate a first feedback signal based on the first delayed value;
   a second delay element coupled to the quantizer, the second delay element being configured to delay the digital value by a second delay period different from the first delay period resulting in a second delayed value, wherein the first delay element and the second delay element are non-cascaded, such that the first delay period and the second delay period are uncorrelated; and
   a second digital-to-analog converter coupled between the second delay element and the forward signal path, the second digital-to-analog converter being configured to generate a second feedback signal based on the second delayed value, wherein the forward signal path produces the first analog signal based on the input signal, the first feedback signal, and the second feedback signal, such that the second feedback signal compensates for the first delay period.

9. The analog-to-digital converter of claim 8, wherein the forward signal path comprises a circuit topology selected from a group consisting of a lowpass topology, a bandpass topology, a highpass topology, a feedback topology, a feedforward topology, and a mixed feedforward-feedback topology.

10. The analog-to-digital converter of claim 8, wherein the first digital-to-analog converter generates the first feedback signal with a first gain and the second digital-to-analog converter generates the second feedback signal with a second gain, wherein the second gain is not equal to the first gain.

11. The analog-to-digital converter of claim 8, wherein the second digital-to-analog converter comprises a non-return-to-zero digital-to-analog converter.

12. The analog-to-digital converter of claim 8, wherein the second digital-to-analog converter comprises a return-to-zero digital-to-analog converter.

13. The analog-to-digital converter of claim 8, wherein the second delay period is less than the first delay period.

14. The analog-to-digital converter of claim 8, wherein the second delay period is greater than the first delay period.

15. A sigma-delta modulator comprising:
an input node for receiving an input signal;
a first integrator having a first input and a first output, the first input being coupled to the input node;
a quantizer having a quantizer input and a quantizer output, the quantizer input being coupled to the first output, wherein the quantizer is configured to convert a first analog signal at the quantizer input to a digital value at the quantizer output;
a first delay element coupled to the quantizer output, the first delay element being configured to delay the digital value by a first delay period resulting in a first delayed value;
a first digital-to-analog converter coupled between the first delay element and the first input, the first digital-to-analog converter being configured to convert the first delayed value to a first analog value at the first input;
a second delay element coupled to the quantizer output, the second delay element being configured to delay the digital value by a second delay period resulting in a second delayed value, wherein the second delay period is not equal to the first delay period and the second delay period is independent of the first delay period; and
a second digital-to-analog converter coupled between the second delay element and the first input, the second digital-to-analog converter being configured to convert the second delayed value to a second analog value at the first input.

16. The sigma-delta modulator of claim 15, further comprising:
a second integrator coupled between the input node and the first integrator, the second integrator having a second input and a second output, the second input being coupled to the input node and the second output being coupled to the first input;
a third digital-to-analog converter coupled between the first delay element and the second input, the third digital-to-analog converter being configured to convert the first delayed value to a third analog value at the second input.

17. The sigma-delta modulator of claim 16, wherein the second delay period is less than the first delay period.

18. The sigma-delta modulator of claim 17, the quantizer having a sampling period associated therewith, wherein the second delay period is equal to one quarter of the sampling period and the first delay period is equal to three quarters of the sampling period.

19. The sigma-delta modulator of claim 17, the quantizer having a sampling period associated therewith, wherein the second delay period is equal to one half of the sampling period and the first delay period is equal to the sampling period.

* * * * *